VOLTAGE CONTROLLABLE TUNING CIRCUIT WHICH RESPONDS LINEARLY IN FREQUENCY WITH LINEAR DIAL CHANGES

Filed Dec. 17, 1968

INVENTORS
FREDERICK RICHTER
FRANK T D'ANNA
PATRICK BUCKLEY
Hopgood & Calimafde
ATTORNEYS United States Patent Office 3,528,043

Patented Sept. 8, 1970

3,528,043

VOLTAGE CONTROLLABLE TUNING CIRCUIT WHICH RESPONDS LINEARLY IN FREQUENCY WITH LINEAR DIAL CHANGES

Frederick Richter, Huntington, Frank T. D'Anna, Plainview, and Patrick J. Buckley, Commack, N.Y., assignors to Servo Corporation of America, Hicksville, N.Y., a corporation of New York Filed Dec. 17, 1968, Ser. No. 784,414
Int. Cl. H03j 3/18, 3/20
U.S. Cl. 334—14 4 Claims

ABSTRACT OF THE DISCLOSURE

A device for tuning a circuit employing a voltage controllable frequency determining element is described. The tuning circuit responds linearly in frequency to a voltage controlled from a dial which provides selection of tuning frequencies with discrete incremental variations. The dial frequency selections are transformed by a switching network to a first voltage directly proportional to dial frequencies and the first voltage is applied to a non-linear network to generate a control voltage which is applied to the frequency determining element to establish a tuning circuit frequency corresponding to the selected dial frequency.

This invention relates to a radio frequency variable tuning circuit. More specifically, this invention relates to a radio frequency tuning circuit employing a voltage controllable frequency determining element for tuning the front end of a superheterodyne radio receiver.

In our copending patent application Ser. No. 791,849 filed on the same date as this application and entitled "Synthesized Radio Receiver," assigned to the same assignee, a radio receiver is described which is electronically tunable over a wide bandwidth. The receiver employs a plurality of dials, each of which provides linear frequency adjustments at fixed increments. However, the frequency determining elements used in tuning circuits in the receiver do not respond as a linear function of the linear dial changes, and, as a result, recourse must be had to means for rendering the response of the frequency determining element linear with respect to the dial frequency. Past attempts have involved utilizing such devices as eccentrically shaped capacitor plates or non-linear cams to correct for the non-linear response of the frequency determining element. These mechanical linearizing devices are not necessarily satisfactory for a receiver which is tunable over a very wide range and uses electronically variable frequency determining elements, such as voltage variable capacitors or electronically variable inductors.

Accordingly, it is an object of this invention to provide a variable tuning circuit which is small in size, economical to produce and accurately responds to a desired dial frequency.

It is a further object of the invention to provide an entirely electronically controlled device for varying the tuning characteristics of a circuit in a linear relationship with a dial frequency.

Figure 1:
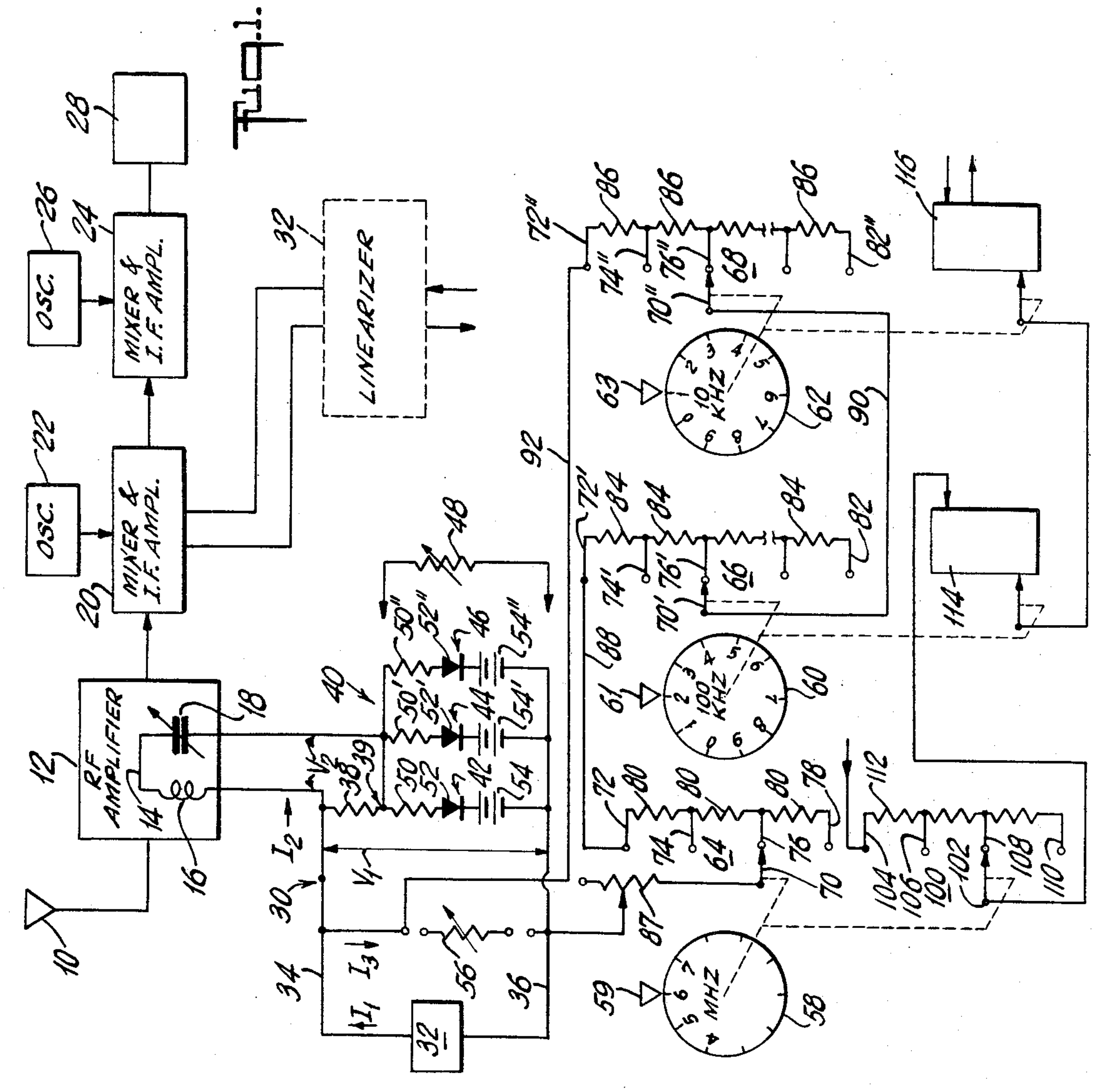
Figure 2:
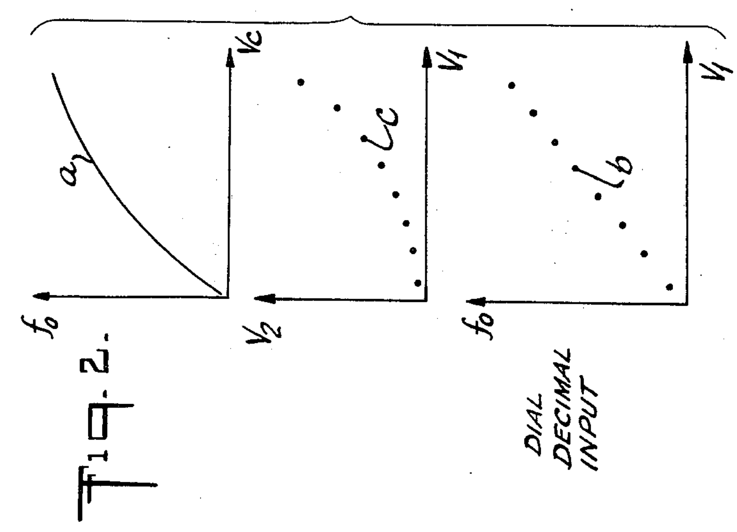

These objects are accomplished by our invention which is described as follows in a preferred embodiment in conjunction with the drawings, wherein FIG. 1 is a schematic representation of a receiver employing a voltage controllable frequency determining element and a device for adjusting the element as a linear function of a dial frequency; and FIG. 2 is a group of curves which show several response curve characteristics of circuits used in the schematic of FIG. 1, as well as the frequency response characteristic of a typical frequency determining element.

Briefly stated, our invention contemplates a device for tuning a circuit which employs a voltage controllable frequency determining element, by first generating a voltage having a magnitude which is proportional to a dial frequency indication and applying this voltage to a non-linear network having a transfer function which is the inverse of that of the voltage controllable frequency determining element.

In FIG. 1, an antenna 10 couples radio frequency (RF) signals to an RF amplifier 12 which employs one or several tunable circuits such as tuning circuit 14 comprising an inductance 16 and a voltage controllable variable capacitor 18. The RF amplifier 12 provides a broad band tuning range of, say, from 4 to 8 mHz. The tuning circuit 14 serves to provide a so-called narrow frequency passband through which the RF amplifier can select particular signals within the broad passband to maintain required image and spurious signal rejections. The output of the amplifier 12 is coupled to a mixer and intermediate frequency (IF) amplifier 20. An oscillator 22 is coupled to the mixer to convert the input signal frequencies to a higher frequency range. The oscillator 22 provides selected frequencies from 7 to 10 mHz. and converts the input signals to an IF frequency centered from 11 to 17 mHz. The output of the IF amplifier 20 is passed to a second mixer and a terminal IF amplifier in circuit 24 to which is also coupled an oscillator 26. The oscillator 26 provides the desired terminal IF frequency for utilization of the antenna signals to which the receiver is tuned. The oscillator 26 is variable at very small increments to provide, in conjunction with a very narrow terminal IF bandwidth of the IF amplifier in the circuit 24, a fine tuning capability of the entire receiver. A utilization device such as a loud speaker or tape recorder 28 is shown at the output of the circuit 24.

The RF amplifier 12 as well as the mixer and IF amplifier 20 are tuned to a frequency as determined by a dial located on a front panel attached to the receiver. The tuning circuits in the receiver RF amplifier and the circuit 20 employ voltage controllable frequency determining elements such as the variable capacitor 18 shown in the RF amplifier 12. A pair of frequency control signals are applied to the frequency determining elements in the RF amplifier 12 and the circuit 20. The frequency control signal for the amplifier 12 is shown in detail in a linearizer network generally indicated at 30 and the frequency control signal for the circuit 20 is derived from a linearizer network indicated at 32 within the dotted lines. The two networks are essentially the same except for component values so that only the cooperation of circuit 32 with that of circuit 30 is described.

The network 30 comprises a constant current device 32 providing at output terminals 34–36 a constant current labelled $I_1$. This current may be obtained from any suitable constant current source such as a field effect transistor in series with a conventional transistor. The generation of a constant current source is well known and further description thereof will not be necessary. The current $I_1$ generated by the constant current source 32 branches off into two parts labelled $I_2$ and $I_3$ in the drawing. $I_2$ proceeds into a series network composed of a resistor 38 and a non-linear network generally indicated at 40 and composed of a plurality of parallel branches such as 42–44–46 which are normally open-circuited but are rendered closed when the voltage developed at the junction 39 between resistor 38 and network 40 exceeds a voltage potential located in each of these branches 42–44–46. The total resistance presented by the non-linear network 40 may be represented by an equivalent variable resistor 48.

The branches 42–44–46 are similar. Branch 42 comprises a resistor 50, a diode 52 and a back-biasing voltage 54. The diode is so inserted in the branch circuit 42 that the potential 54 prevents conduction of the diode unless the voltage at the junction 39 is sufficiently positive to overcome the back-bias potential. In a similar fashion, the branches 44–46 are each provided with resistors 50′ and 50″, diodes 52′ and 52″ and potential 54′ and 54″. The potentials 54, 54′ and 54″ are each different so that the branches 42–44–46 will conduct at different levels of the voltage available at the junction 39. The potentials 54–54′–54″ may be obtained from any suitable source.

The combined resistance of the resistor 38 and the equivalent resistor 48 is adjusted to be substantially greater than the impedance presented by the branch through which the current $I_3$ flows. As a result, the current $I_3$ is substantially the same as current $I_1$ so that an accurate voltage labelled $V_1$ may be established across the combined resistors 38 and 48.

The voltage $V_1$ is developed in a network including dials indicating the desired tuning frequency of the network 14. Thus, between the terminals 34 and 36 is placed a variable impedance device 56 which represents the equivalent resistance of the circuit employed for converting the desired dial tuning frequency to a voltage. Three dials are shown 58–60–62 with fixedly mounted dial pointers 59–61–63. The dial 58 selects the mHz. digit of the frequency range to which the circuit 14 is to be tuned and therefore is provided with four positions labelled 4, 5, 6 and 7. The dial 60 selects the next most significant digit of the frequency to which the circuit 14 is to be tuned, and thus controls the 100 kHz. frequency digit and is provided with ten positions labelled from 0 through 9 as shown in FIG. 1. Dial 62 controls the 10 kHz. digit of the frequency to which the circuit 14 is to be tuned and is also provided with ten positions labelled 0 through 9. It thus can be seen that each of the dials controls a decimal increment of the tuning circuit 14.

Each of the dials 58–60–62 is respectively coupled to a single pole multiple position switch 64–66–68. The switch 64 is provided with a pole 70 which selectively couples to one of the contacts 72–74–76–78 corresponding respectively to 4, 5, 6 and 7 mHz. Each of these contacts 72–74–76–78 is interconnected by equal valued resistors labelled 80. The switch 66 is provided with a pole 70′ and ten contacts such as 72′–74′–76′–82. These contacts respectively correspond to the frequency selected by dial 60, i.e. 0, 100 kHz., 200 kHz., up to 900 kHz. The other contacts for intermediate frequency positions are not shown. Between contacts such as 72′ and 74′ is placed a resistor 84 and similarly between contacts 72′ and 76′ is placed a like resistor 84. Similar resistors are placed between the other contacts of the switch 66 up to contact 82. In a similar fashion, the switch 68 is provided with a pole 70″ controlled in position by the dial 62 and ten contacts such as 72″–74″–76″–82″. Also between the contacts 72″ and 74″ is placed a resistor 86 and a like resistor is placed between the subsequent contacts up to contact 82″.

The resistance values of the resistors 80–84–86 are so chosen that resistor 84 is ten times the value of resistor 86 and resistor 80 is ten times the value of resistor 84. Furthermore, the contacts on the switches and the poles are so connected in series that starting from, for instance, terminal 36, which is coupled to the constant current source 32, one passes through a variable resistor 87 to the pole 70 which is coupled to a selected portion of the series connected resistors 80 between contacts of the switch 64 (in the case indicated between contacts 76 and 72), then via line 88 to the contact on the switch 66 representing the least significant digit, i.e. contact 72′, thence through a portion of the series connected resistors between the contacts of switch 66 (i.e. between contacts 72′ and 76′) to the pole 70′, thence via line 90 to the pole 70″, thence through a selected portion of the resistors interconnecting the contacts of switch 68 from contact 76″ to the contact 72″ and back to terminal 34 via line 92.

Thus, the equivalent resistance 56 placed between the terminals 34 and 36 is directly proportional to the frequency selected by the dials 58–60–62. For instance, if the desired tuning frequency is 6.21 mHz., then the pole 70 is coupled to the contact 76 by dial 58, which is rotated to place the six position opposite the dial indicator 59, and the dial 60 is moved to place its number two position opposite the indicator 61, and similarly the dial 62 is rotated to place its position one opposite the indicator 63. As a result, the total impedance presented between the terminals 34 and 36 will have a direct proportional relationship to the dial frequency indication. Since the current $I_3$ is substantially the same as current $I_1$, the voltage developed across the terminals 34–36, $V_1$, will be direclty proportional to the dial frequency indication.

As the voltage $V_1$ is changed depending upon the incremental value by the position of the dials, the branches 42–44–46 will be rendered conductive as the potential 39 increases. The voltage $V_2$ developed across resistor 38 is applied to the voltage controllable frequency determining element 18 in the tuning circuit 14 of the RF amplifier 12. The voltage $V_2$ will follow the voltage $V_1$ subject to the non-linear changes produced as selected branches 42–44–46 are rendered conductive.

The voltage $V_2$ then is effectively similar to voltage $V_1$ except for a wave shaping provided by the branches. By approximately choosing the value of the potentials 54–54′–54″, as well as the value of the resistors 50–50′–50″, a tuning curve may be obtained at the output $V_2$ which is effectively the inverse of the tuning characteristic of the variable capacitor 18.

In FIG. 2 a curve *a* is shown which represents a typical tuning curve for a voltage controllable variable capacitor 18 as a function of the frequency of the network 14, where $V_c$ is the voltage applied to the variable capacitor. In order to provide a linear response of the network 14, it is desired that the exponential characteristic of this tuning curve *a* be effectively modified to obtain a tuning curve that is directly proportional to the dial frequency. This is accomplished by providing first a voltage $V_1$ which is directly proportional to the decimal input provided by the dials. This voltage $V_1$ is shown in dotted form at *b* to represent its incremental variable nature in response to changes of dial positions. It is to be realized that there are as many points on this curve *b* as there are incremental positions of the switches, but for the purpose of illustrating its proportional relationship to the dial frequencies, only several points are shown.

In addition, a curve *c* is illustrated which represents the inverse of the curve *a*. This curve *c* is obtained by applying the voltage $V_1$ to the network 40 and obtaining the voltage $V_2$ formed across the resistor 38. The projection of the dots of curve *c* onto the abscissa line labelled $V_1$ illustrates a direct proportional relationship. However, the projection of the dots of curve *c* onto the ordinate line $V_2$ is non-linear in a manner which is inverse to that of curve *a* so that the final tuning frequency of the circuit 14 in RF amplifier 12 may respond in direct proportional relationship to the dial frequency input from the dials 58–60–62.

With the dials positioned for a tuning frequency of 4.00 mHz., the total resistance between the terminals 34 and 36 must be such that the voltage applied to the frequency determining element provides the desired lowest possible dial frequency. Since the poles of the switches 64–66–68 are all coupled to the contact representing the least significant digit, i.e., zero, a variable resistor 87 is provided between the terminal 36 and the pole 70. This variable resistor provides the minimum amount of resistance needed to establish a voltage $V_1$ representative of the minimum tuning frequency of 4 mHz. With the dials positioned to select a higher frequency than that of the minimum, additional resistance will be introduced by the several switches. The direct proportional relationship of the total impedance between the terminals 34 and 36 as for instance represented by the equivalent resistor 56 is represented by the difference between the resistance of the minimum tuning frequency selection resistor 87 and the resistance introduced by the dials.

The linearizer 32 as previously mentioned controls the tuning circuits for the mixer and IF amplifier circuit 20. This linearizer 32 was further stated to contain circuitry similar to that used in network 30. Accordingly, since the receiver is of the superheterodyne type and the desired tuning frequencies of the first mixer and IF amplifier 20 bear a direct relationship to the desired dial tuning frequencies, a second set of switches is provided in ganged relationship with the switches 64–66–68.

Thus a second switch 100 is controlled by the dial 58 and is provided with a pole 102 and a plurality of contacts such as 104–106–108–110. Again, resistors such as 112 interconnect the contacts 104–106–108–110. The switches 64 and 100 may be conveniently controlled by the common dial 58 by placement of separate wafers on a common shaft (not shown). In a similar manner, a switching network 114 and a switching network 116 may be provided, each respectively controlled by the dials 60 and 62. The interconnections of the switches 100–114–116 are made with corresponding lines like 88–90–92 to provide a variable resistance. Since the tuning frequency of the mixer and IF amplifier circuit 20 will be in a range between 11 and 17 mHz., the values of the resistors such as 112 will be different from the resistor 80 used with the switch 64 in circuit 30. In other respects, the performance of the linearizer 32 is similar to that for circuit 30 and further description will not be necessary.

It thus may be seen that we have provided a unique circuit for obtaining a voltage tuning curve. Dials, representing decimal digits of a desired tuning frequency, are used to provide a voltage which varies in direct proportion to the dial positions and may be used to generate a voltage having a characteristic which is the inverse of the transfer function of a voltage controllable frequency determining element. A highly accurate tuning control of a circuit is obtained which is small in size, reliable, and economical to produce.

While the invention is described in detail in connection with a preferred embodiment thereof, it is to be understood that modifications and variations thereof fall within the scope of the invention as defined in the appended claims.

We claim:

1. A device for tuning a circuit employing a voltage controllable frequency determining element exhibiting a non-linear frequency-voltage characteristic in response to a voltage applied thereto, comprising:

means for producing a control voltage linearly proportional to a desired tuning frequency of the circuit, said means including a constant current source having a pair of terminals, a variable impedance device coupled across said constant current source, and a frequency selecting dial coupled to said variable impedance device to vary the impedance of said variable impedance device;

said control voltage being magnitude variable at preselected incremental values corresponding to incremental changes in the desired tuning frequency;

said variable impedance device including a plurality of series connected resistors, with one end of the series connected resistors coupled to the constant current source and a multiple contact switch controlled by the dial, one of said switch contacts being coupled to the constant current source and the other contact selectively coupled through a portion of said series connection to the constant current source to provide a variable impedance across the current source; and, a non-linear network having a voltage transfer function that is inverse to that of the said characteristic of the frequency determining element, said non-linear network having an input and an output;

said network input being coupled to said control voltage and the output of the network being coupled to said frequency determining element to determine the frequency of the tuned circuit in direct proportion to the desired tuning frequency.

2. The invention in accordance with claim 1 wherein said variable impedance device includes a first group of like series connected resistors and a second group of like series connected resistors, each resistor in said second group having substantially one tenth of the resistance of a resistor in the first group, said first and second groups being effectively coupled in series across the constant current source terminals;

a pair of variable switches one of said switches selectively coupling said first group of resistors to one of said terminals of the current source and said second variable switch selectively coupling said second group of resistors to the other terminal of the current source; and a pair of frequency selecting dials respectively controlling the position of the switches, said dials selecting decimal tuning frequencies separated from one another by a decade.

3. The device as recited in claim 1, wherein said resistors are like valued to provide like incremental tuning frequency changes in response to a dial position change.

4. A device as recited in claim 1, wherein said non-linear network includes a voltage divider network comprising a first resistance and a second voltage variable resistance in series with the first resistance, said voltage divider network being coupled across the control voltage to develop a voltage across the first resistance, said voltage across the first resistance being coupled to said frequency determining element, said voltage variable resistance including a plurality of parallel circuit branches, each of said circuit branches having a diode, a diode reverse biasing voltage source, and a resistor, all in series connection, said diode reverse biasing voltage source in each branch being selected to provide a non-linear variation of the voltage developed across the first resistance in accordance with the inverse transfer function of the frequency determining element.

References Cited

UNITED STATES PATENTS

| | | | |
|---|---|---|---|
| 3,117,293 | 1/1964 | Mortley | 334—15 |
| 3,233,197 | 2/1966 | Deichen | 334—15 |
| 3,353,117 | 11/1967 | Renkowitz | 334—15 X |
| 3,452,223 | 6/1969 | Pappas | 334—15 X |

PAUL L. GENSLER, Primary Examiner

U.S. Cl. X.R.

325—464; 328—145; 330—178; 334—15